(12) United States Patent
Liang et al.

(10) Patent No.: US 6,997,664 B1
(45) Date of Patent: Feb. 14, 2006

(54) APPARATUS FOR LOADING/UNLOADING WAFERS TO AND FROM SEMICONDUCTOR FABRICATION EQUIPMENT

(75) Inventors: Muh-Wang Liang, Hsinchu Hsien (TW); Chun-Kai Huang, Hsinchu Hsien (TW); Jiann-Cherng Chen, Hsinchu Hsien (TW); Tzong-Ming Wu, Hsinchu Hsien (TW); Ping-Yu Hu, Hsinchu Hsien (TW); Kuan-Chou Chen, Hsinchu Hsien (TW)

(73) Assignee: Industrial Technology Research Institute, Hsin Chu Hsien (TW)

( * ) Notice: Subject to any disclaimer, the term of this patent is extended or adjusted under 35 U.S.C. 154(b) by 1274 days.

(21) Appl. No.: 09/619,388

(22) Filed: Jul. 19, 2000

(51) Int. Cl.
*B65G 49/07* (2006.01)
(52) U.S. Cl. .................. 414/217.1; 414/940
(58) Field of Classification Search ............. 414/217.1, 414/630, 940; 187/267
See application file for complete search history.

(56) References Cited

U.S. PATENT DOCUMENTS

| | | | | |
|---|---|---|---|---|
| 4,746,256 A | * | 5/1988 | Boyle et al. ............. | 414/217.1 |
| 4,923,054 A | * | 5/1990 | Ohtani et al. ............. | 187/267 |
| 5,674,039 A | * | 10/1997 | Walker et al. ............. | 414/222.05 |
| 5,931,631 A | * | 8/1999 | Bonora et al. ............. | 414/416.01 |
| 6,082,949 A | * | 7/2000 | Rosenquist ............. | 414/217 |
| 6,135,698 A | * | 10/2000 | Bonora et al. ............. | 414/416.01 |
| 6,364,593 B1 | * | 4/2002 | Hofmeister et al. ...... | 414/217.1 |
| 6,364,595 B1 | * | 4/2002 | Bonora et al. ............. | 414/416.1 |

* cited by examiner

*Primary Examiner*—James W. Keenan
(74) *Attorney, Agent, or Firm*—Rabin & Berdo, P.C.

(57) ABSTRACT

The present invention proposes an apparatus for loading and unloading wafers to and from the semiconductor fabrication equipment. The present invention uses two U-shaped port plate supporters of high rigidity to respectively join with drive devices such as lead screws, shaft bearings, and a lead device, and then join with components such as a port plate, a port door, and a base. The assembly is driven by a motor via timing pulleys, timing belts, idle wheels, a pair of lead screws, shaft bearings, and a lead device. An encoder is matched for feedback control. Thereby, accurate positioning of the main mechanism of the wafer pod responsible for upward and downward movement can be achieved so as to increase the accuracy and reliability of positioning transfer of wafers. Secondarily, the contamination of particles resulted from the motion of the main mechanism can be reduced by using an intake filtering system. Because the present invention adopts a modular design, the drive source of each unit is isolated and the circuit of each unit is hidden so that the whole structure is most compact and the assembling/disassembling and maintenance are easier.

7 Claims, 9 Drawing Sheets

APPARATUS FOR LOADING/UNLOADING WAFERS TO AND FROM SEMICONDUCTOR FABRICATION EQUIPMENT

FIELD OF THE INVENTION

The present invention relates to an apparatus for loading and unloading wafers to and from the fabrication equipment and, more particularly, to an apparatus conforming to the specification of SMIF (standard mechanical interface) E19.4 200 mm standards. The present invention is compatible with existent openers of IC factories, and can integrate the wafer pod into the fabrication equipment to form an automated wafer separating and fabricating apparatus.

BACKGROUND OF THE INVENTION

The purpose of a SMIF system is to isolate the semiconductor fabrication equipment and wafers in a clean environment of class 1, while the handler working in a clean environment of class 100. The SMIF system can effectively reduce the maintenance cost of the IC factory, increase the yield of products, and provide a comfortable working environment for the handler. The SMIF opener is an apparatus for loading/unloading wafers to and from the semiconductor fabrication equipment. Its primary function is to remove a wafer cassette out from a wafer pod. A robot then grabs a single wafer into the fabrication equipment to proceed the fabrication process. The SMIF opener can easily integrate the wafer pod into the fabrication equipment to form an automated wafer separating and fabricating apparatus.

As shown in FIGS. 1 and 2, because an opener 1*a* in prior art uses three square screws 10*a* for driving and a universal shaft bearing as a lead device (not shown), the assembling with components of the main body such as a port plate 1*a*, a port plate supporter 12*a*, a port door (not shown), and a base 13*a* does not have a reasonable and modular design. Under the situation that there are many associated components, it is difficult to control the assembling accuracy of components of the main body responsible for the upward and downward movement of the opener. The whole structural rigidity is also not high enough. Moreover, under the situations that the pitch error of the three square screws is large and that the synchronism of their movement is bad, the accuracy of positioning transfer of wafers and the lifetime of the equipment will be deteriorated. The assembling of the opener will also be more difficult. In addition, because the assembling of the main body does not adopt a modular design, the structure of the pod hold-down latch mechanism module and the pod unlock mechanism module, both using the same drive source, will be complicated so that the assembling/disassembling and maintenance are difficult. Moreover, the number of components compatible with wafer pods of different sizes will be decreased.

SUMMARY AND OBJECTS OF THE PRESENT INVENTION

The primary object of the present invention is to provide an opener. The present invention uses two U-shaped port plate supporters of high rigidity to respectively join with drive devices such as lead screws, shaft bearings, and a lead device, and then join with components such as a port plate, a port door, and a base. The assembly is driven by a motor via timing pulleys, timing belts, idle wheels, a pair of lead screws, shaft bearings, and a lead device. An encoder is matched for feedback control. Thereby, accurate positioning of the main mechanism of the wafer pod responsible for upward and downward movement can be achieved so as to increase the accuracy and reliability of positioning transfer of wafers. Secondarily, the contamination of particles resulted from the motion of the main mechanism can be reduced by using an intake filtering system. Because the present invention adopts a modular design, the drive source of each unit is isolated and the circuit of each unit is hidden so that the whole structure is most compact and the assembling/disassembling and maintenance are easier.

The various objects and advantages of the present invention will be more readily understood from the following detailed description when read in conjunction with the appended drawings, in which:

DETAILED DESCRIPTION OF PREFERRED EMBODIMENT

Figure 1:
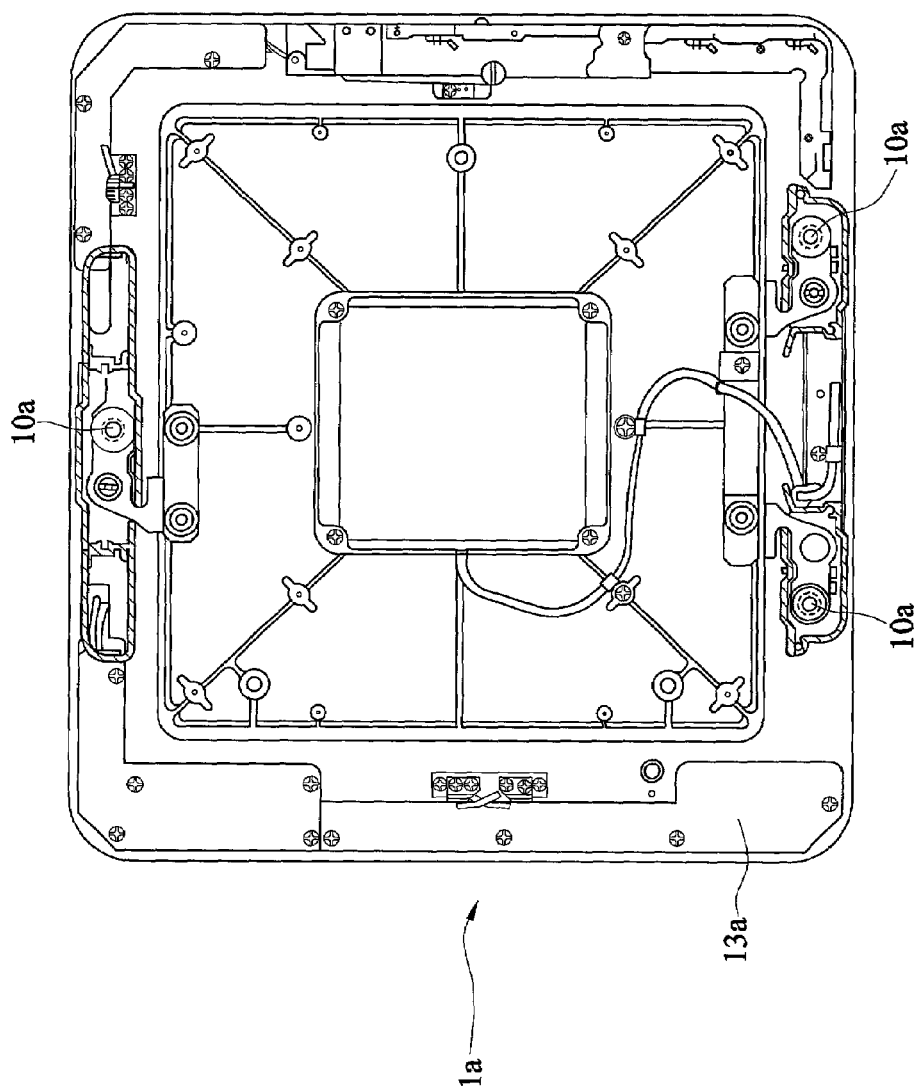
FIG. 1 is a cross-sectional bottom view of an opener in prior art.
Figure 2:
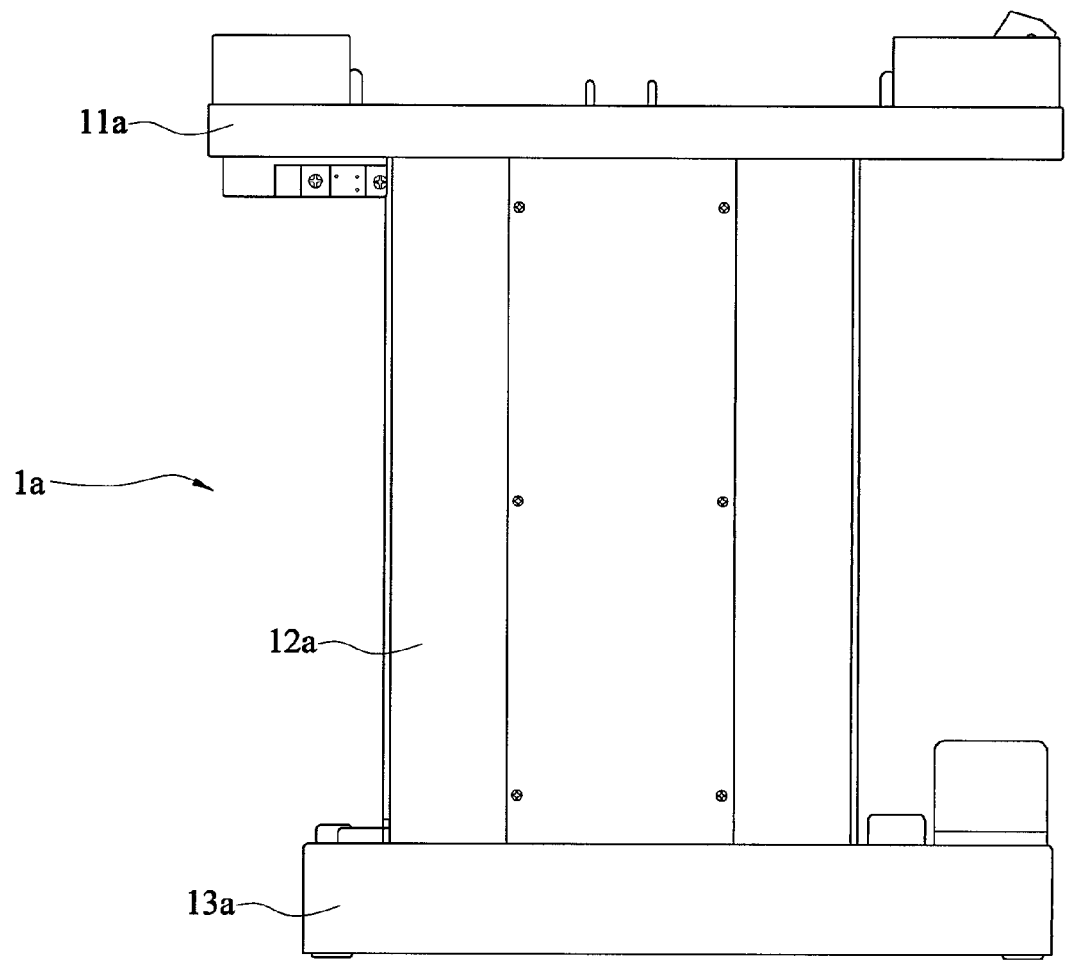
FIG. 2 is a side view of an opener in prior art.
Figure 3:
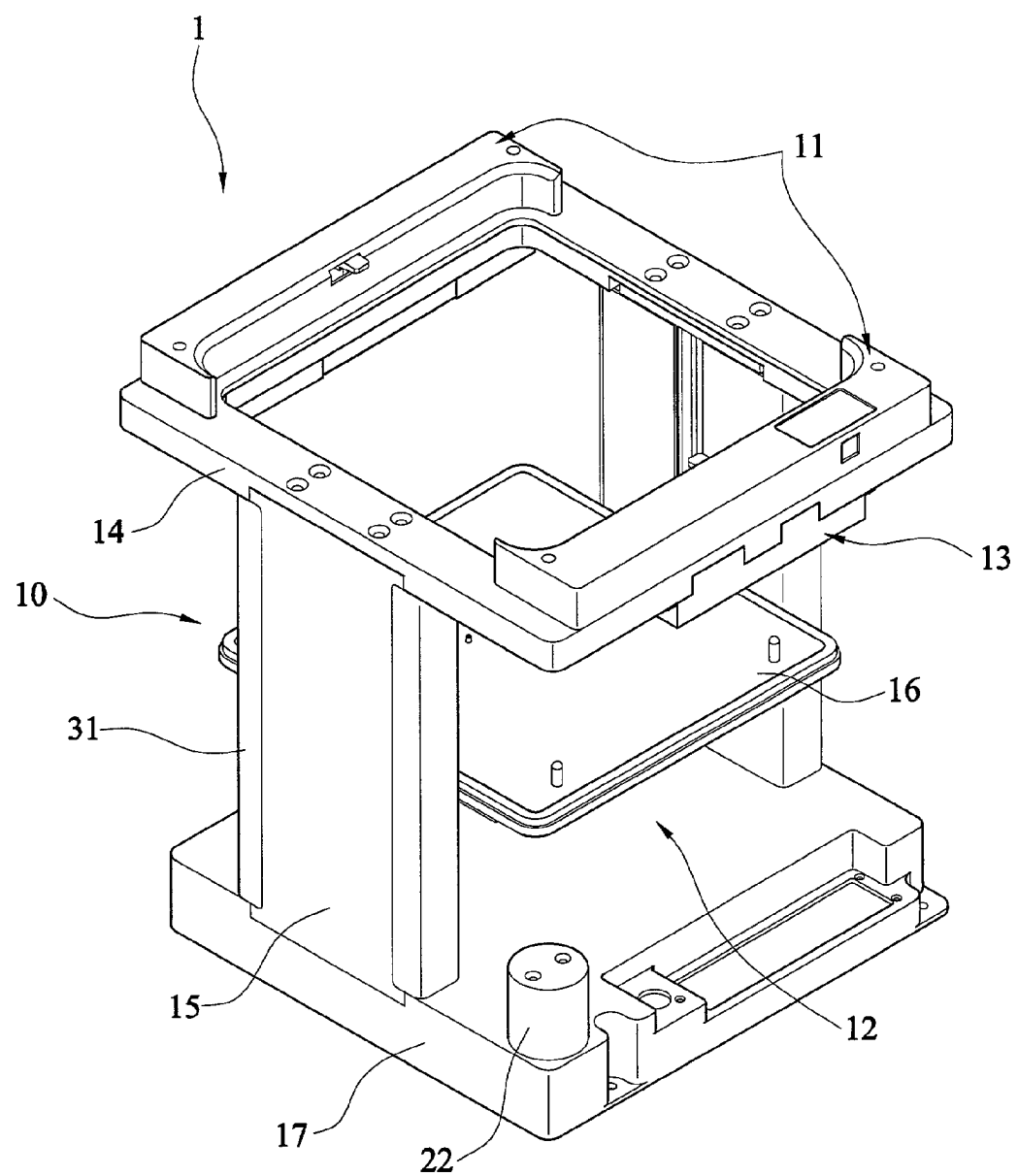
FIG. 3 is a perspective view of the present invention.
Figure 4:
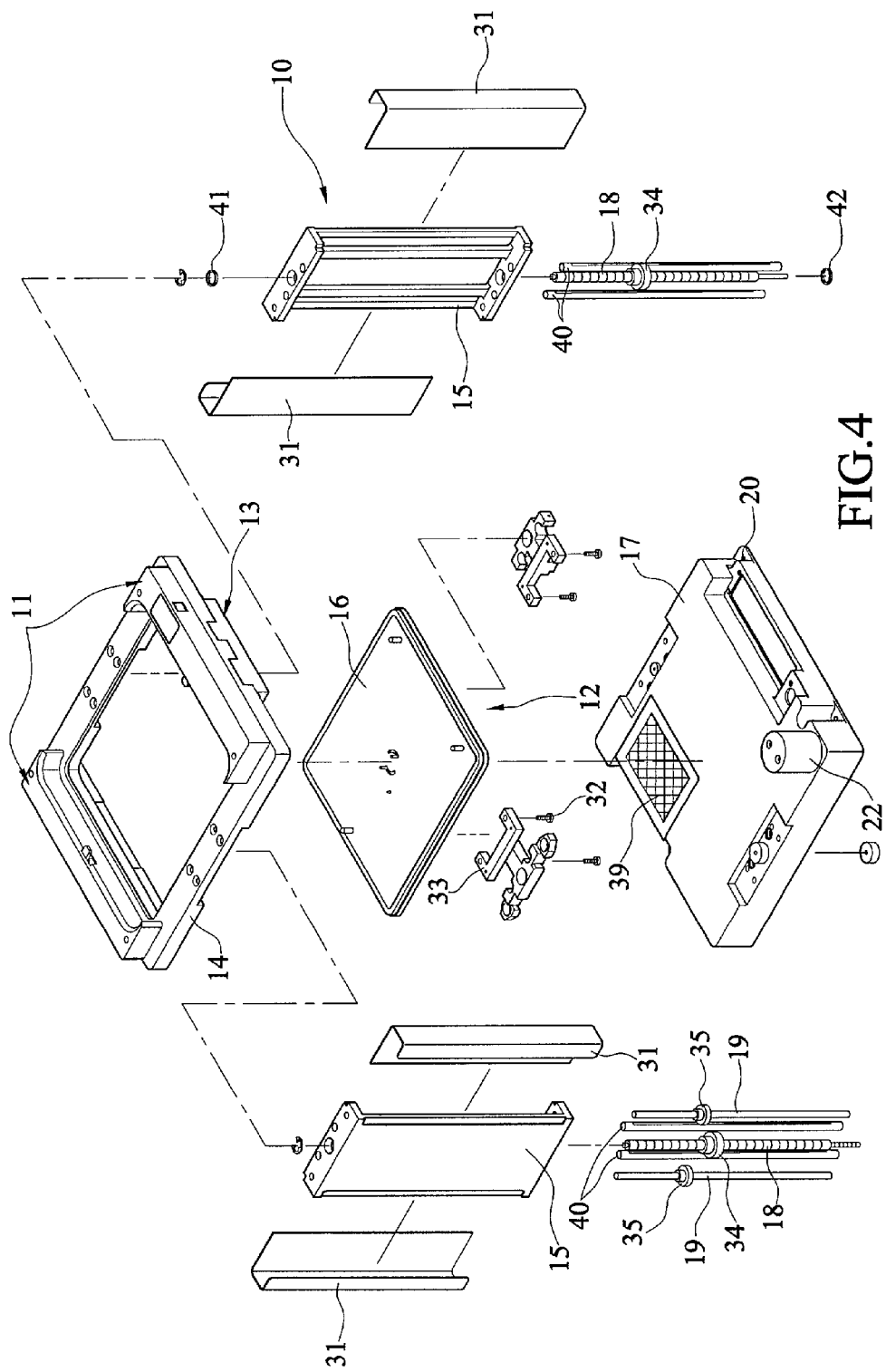
FIG. 4 is an exploded perspective view of the present invention.
Figure 5:
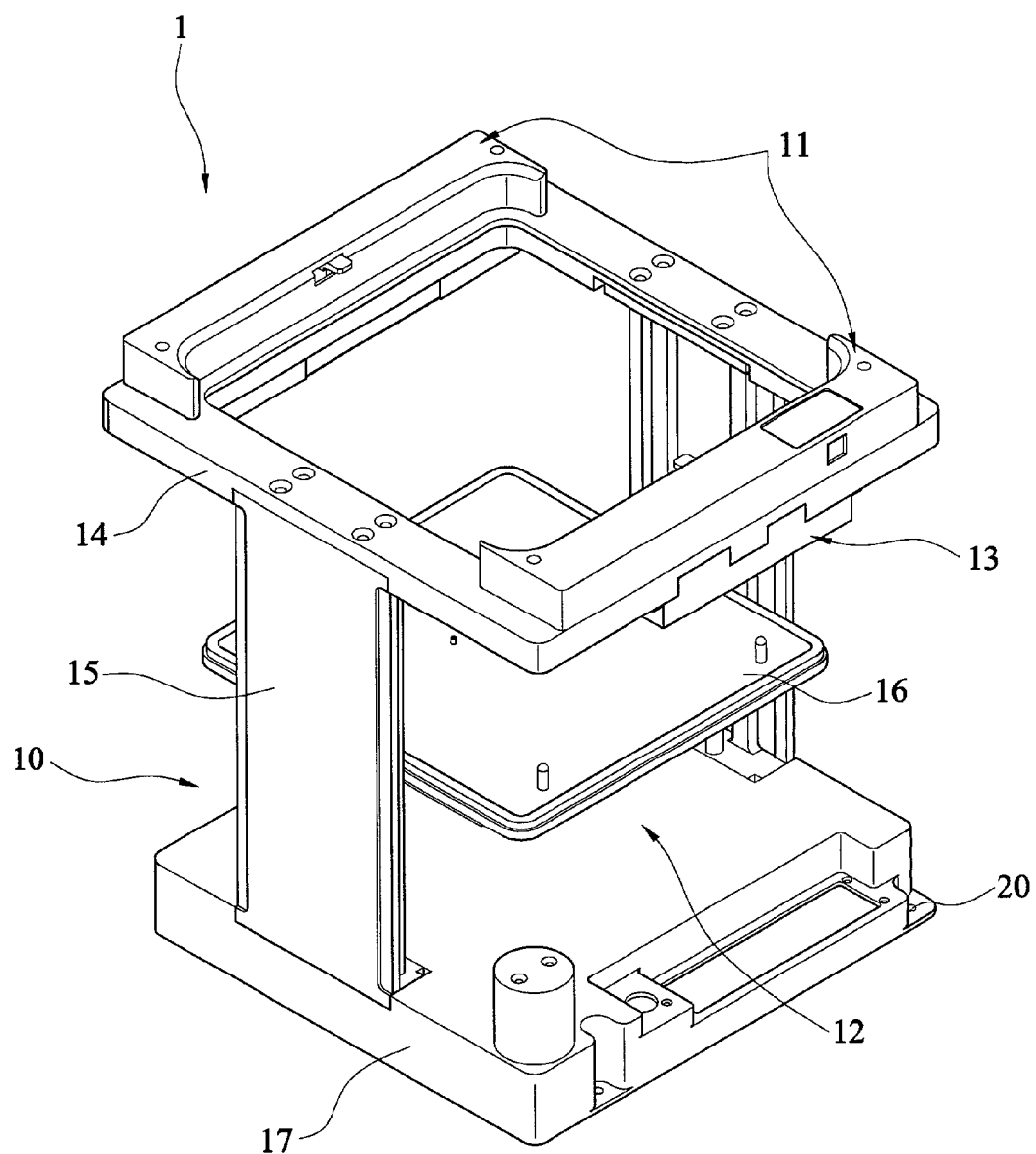
FIG. 5 is a perspective view of the present invention with the protective cover of the port plate supporter removed.
Figure 6:
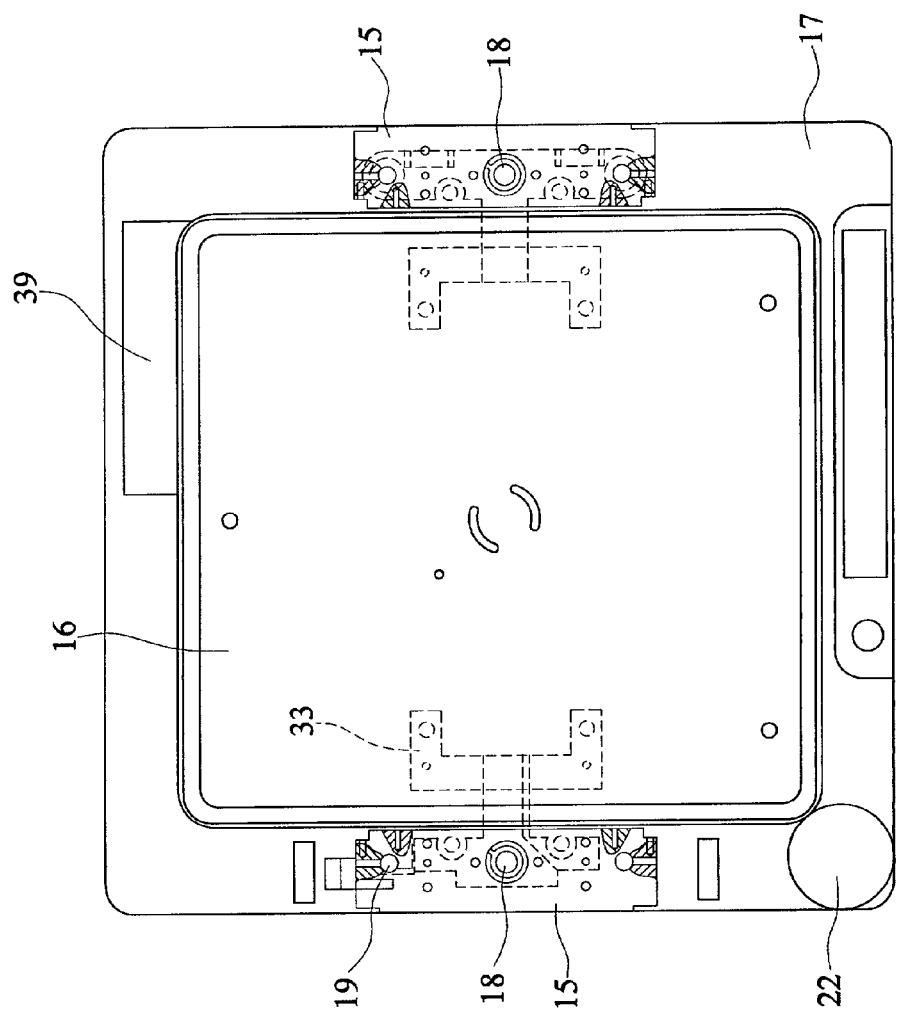
FIG. 6 is a top view of the present invention with the port plate removed.

As shown in FIGS. 3 to 6, the present invention provides an opener. The opener 1 generally comprises a main assembly 10, a pod hold-down latch mechanism module 11, a pod unlock mechanism module 12, a wafer reseat mechanism module 13, and an electrically controlled communication module (not shown). The present invention aims to improve the lifting/lowering mechanism of the main assembly 10.

The main assembly 10 is the main mechanical structure comprising a port plate 14, two port plate supporter 15, a port door 16, and a base 17. The port plate 14 is used to load the wafer pod and is matched with components and circuits (not shown) for scanning wafers. The pod hold-down latch mechanism module 11 and the pod unlock mechanism module 12 are also installed therein. The port plate supporters 15 form the upward/downward passage of the opener and are composed of U-shaped plates of high rigidity. Two lead screws 18 and two lead poles 19 needed for the upward/downward movement of the port door 16 are installed on the port plate supporters 15. The top ends of the port plate supporters 15 are connected to the port plate 14 and the bottom ends of the port plate supporter 15 are connected to the base 17. The two port plate supporter 15 can be sheathed in protective covers 31. The port door 16 is a support platform of the pod door with the pod unlock mechanism module 12 installed thereon. The port door 16 is used to unlock the wafer pod and move the wafer cassette upwards or downwards. Two opposite sides of the port door 16 are secured to two drive plates 33 via screws 32. A screw nut 34 is installed on each of the two drive plates 33. The screw nuts 34 are screwed on the lead screws 18. Two shaft bearings 35 are installed on one of the two drive plates 33.

Figure 7:
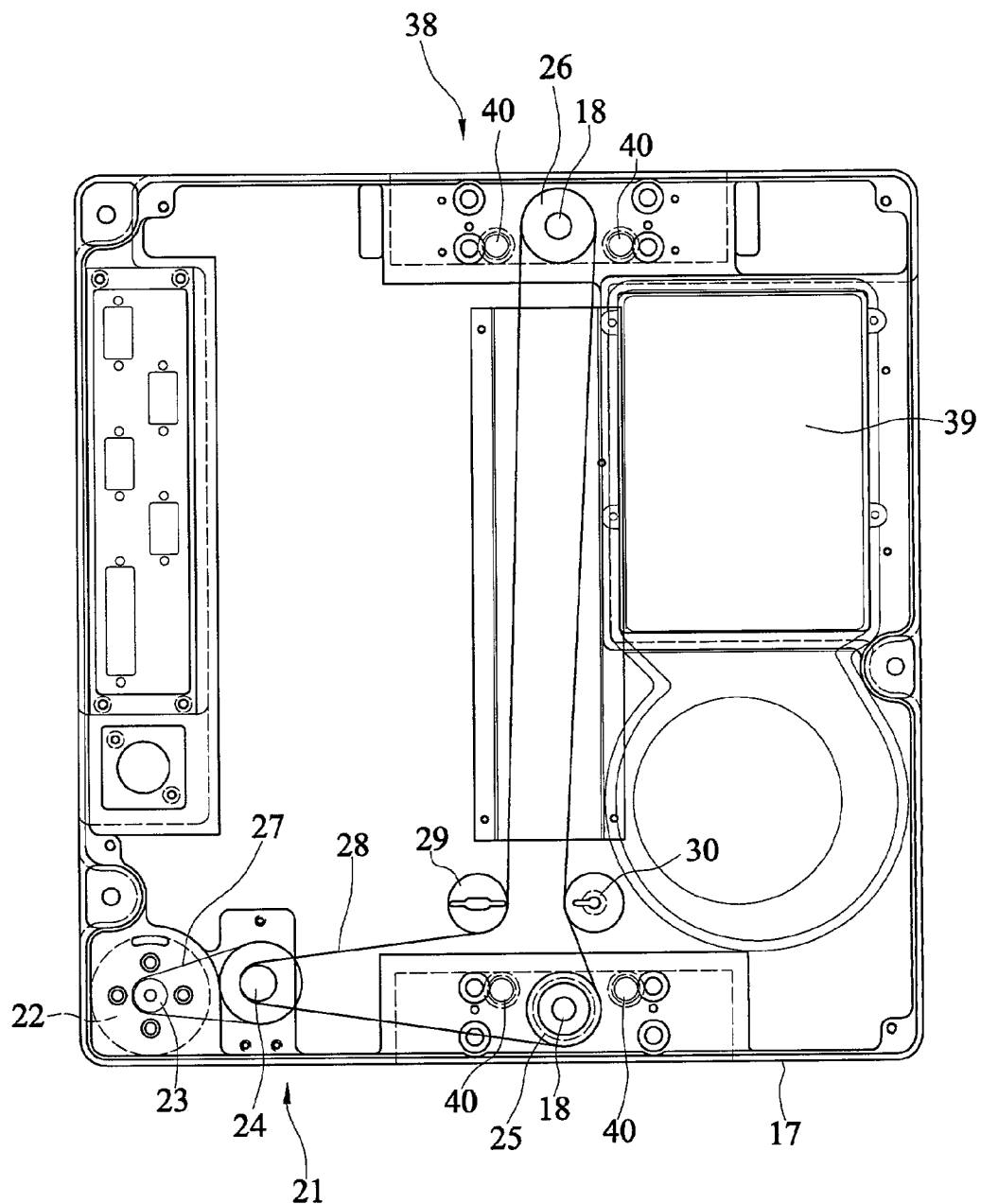
FIG. 7 is a bottom view of the present invention.

The two shaft bearings 35 are slidably matched on the two lead poles 19 to form a lead device. Spring grommets 41 and 42 are installed at the top and bottom ends of the lead screw 18 at the unguided side. The spring grommets 41 and 42 are arranged between the top and bottom ends of the lead screw 18, the port plate 14, and the base 17 so that the top and the bottom of the lead screw 18 can slightly float to absorb the pitch error. The base 17 is the seat of the opener. The opener is fixed on the fabrication equipment via three positioning holes 20. A drive mechanism 21 (shown in FIG. 7) for lifting/lowering the pod door, a motor controller, and a main circuit board of an I/O controller (not shown) are installed in the base 17. The lifting/lowering drive mechanism 21 is in charge of the transfer and positioning of wafers, and comprises a DC servo motor 22, a plurality of timing pulleys 23 to 26, timing belts 27 and 28, and idle wheels 29 and 30. The timing pulley 23 is fixed at the axis of the motor 22, while the timing pulleys 24 to 26 and idle wheels 29 and 30 are supported on the bottom of the base 17. The timing pulley 23 is connected to the timing pulley 24 via the timing belt 27. The timing pulley 24 is then connected to the timing pulleys 25 and 26 via the timing belt 28. The two timing pulleys 25 and 26 are fixed at the bottom ends of the lead screws 18. The idle wheels 29 and 30 sticks to the timing pulley 26. The lifting/lowering drive mechanism 21 can drive the lead screws 18 via the timing pulleys 23 to 26 and the timing belts 27 and 28 to move the pod door upwards or downwards through the power generated by the motor 22. An encoder can also be matched for feedback control so that the main mechanism responsible for the upward/downward movement of the opener can be accurately positioned.

Figure 8:
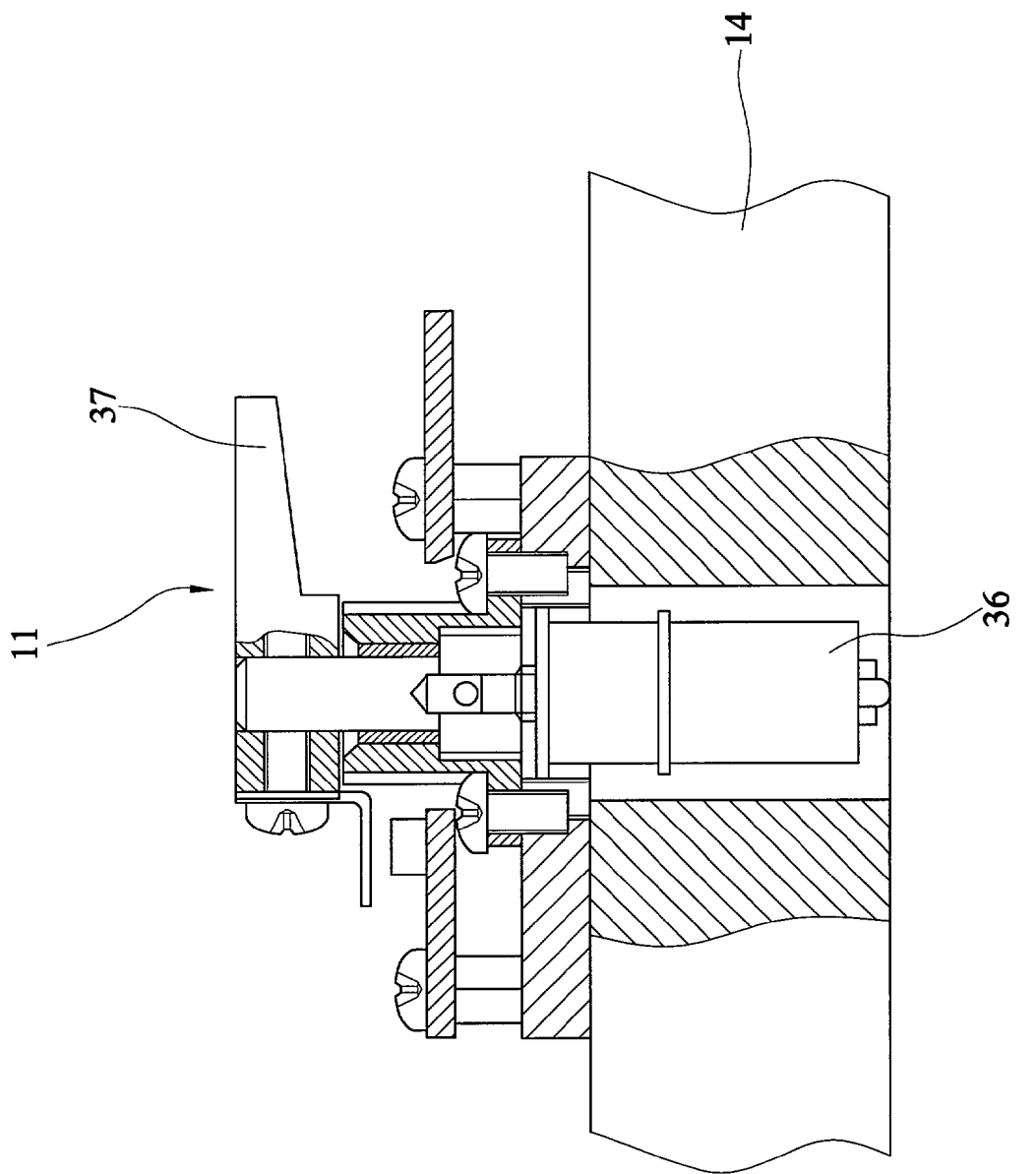
FIG. 8 is a cross-sectional side view of the pod hold-down latch mechanism module of the present invention.
Figure 9:
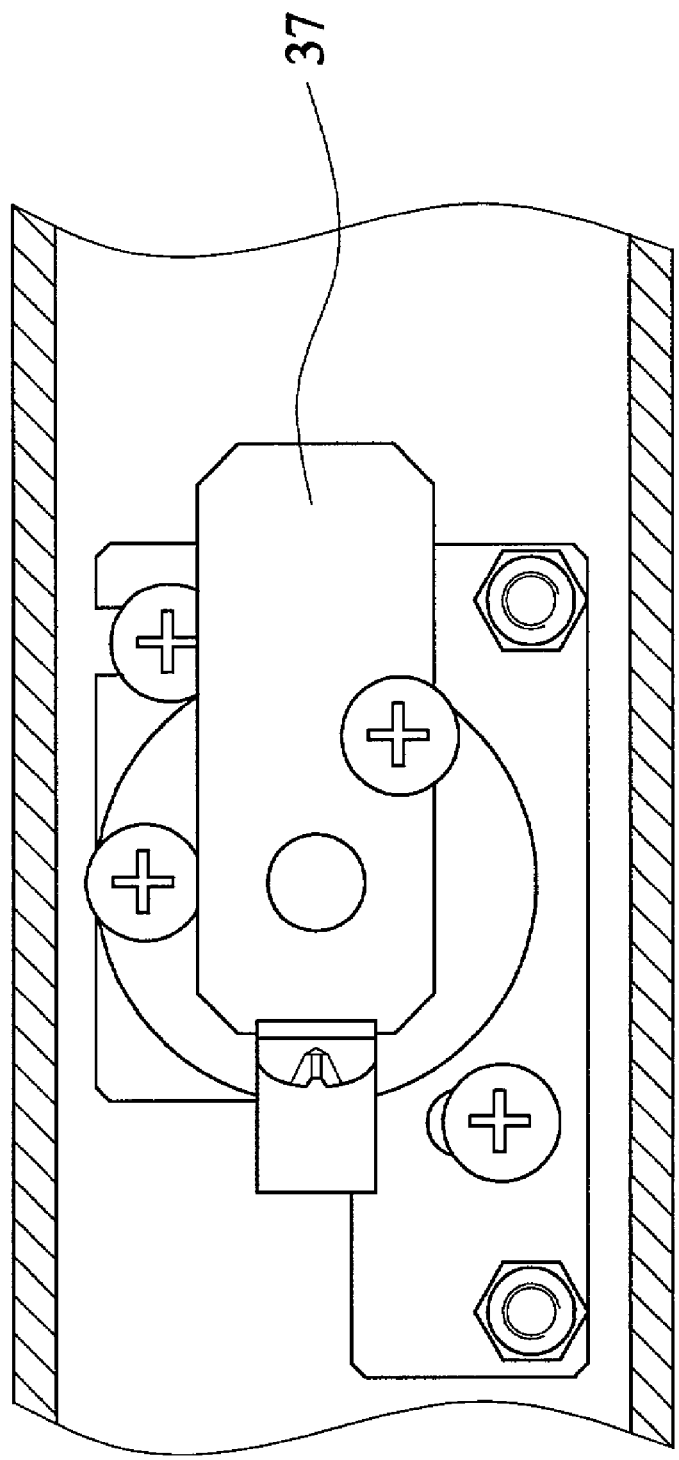
FIG. 9 is a cross-sectional top view of the pod hold-down latch mechanism module of the present invention.

The pod hold-down latch mechanism module 11 is used to secure the pod top of the wafer pod to prevent the pod top from detaching from the port plate 14. Retaining sheets 37 are respectively driven by left and right DC motors 36 (shown in FIGS. 8 and 9) to maintain the compactness and stability of the mechanism. The pod unlock mechanism module 12 situated below the port door 16 is used to control the fastening and unfastening of the internal mechanism of the pod door to facilitate the separation of the pod top and the pod door. The wafer reseat mechanism module 13 can be driven by a sensor to automatically move protrudent wafers into the wafer cassette to prevent the wafers from being damaged during the sealing process of the pod top and the pod door.

In addition, the present invention has an intake filtering system 38 comprising a filter 39 and a plurality of intake pipes 40. The filter 39 is installed on the base 17. The intake pipes 40 are installed at the openings of the protective covers 31 to form air shield so as to prevent particles from going out to contaminate wafers. The contamination of particles generated by the motion of the mechanism can be reduced by using the intake filtering system 38.

As compared to the Asyst Indexer, the present invention has the following advantages:
1. Interface size: The present invention conforms to the specification of the SMIF E19.4 200 mm standards and is compatible with the Asyst Indexer;
2. Port plate supporter: The present invention uses a pair of U-shaped port plate supporters of high rigidity, which can be joined with the drive device such as the lead screws, the shaft bearings, and the lead device independently;
3. Drive system: The drive mechanisms of the present invention adopt independent and modular designs. The pod hold-down latch mechanism module is simple. The accuracy of the lifting/lowering mechanism of the main assembly can also be controlled easily. Moreover, the assembling and testing of the whole mechanism is convenient so that the maintenance and replacement is easy.
4. Quantity of lead screws: The present invention uses two lead screws. The quantity of the lead screws is less so as to simplify the drive mechanism.
Moreover, the top and bottom of the lead screw at the unguided side can slightly float to absorb the pitch error to facilitate synchronous control.
5. Lead device: The present invention uses two lead poles situated at the same side to provide better guidance. Therefore, the accuracy can be controlled easily, and the assembling is convenient.
6. Intake filtering system: the filtering system of the present invention is of long groove-opening limiting type. Air shield can be formed at the openings of the protective covers to prevent particles from going out to contaminate wafers. Particles generated by the moving mechanisms can also be effectively removed.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:
1. An apparatus for loading and unloading wafers to and from fabrication equipment, having a main assembly comprising:
  a port plate;
  a base;
  first and second port plate supporters' each having a top end and a bottom end, the top ends being connected to the port plate and the bottom ends being connected to the base;
  a first lead screw and corresponding lead device installed on the first plate supporter;
  a second lead screw and corresponding lead device installed on the second plate supporter;
  a port door with two screw nuts installed at opposite sides thereof, the port door being coupled to the first and second lead screws via the two screw nuts;
  a lifting/lowering drive mechanism installed on the base, comprising a motor, timing pulleys, and timing belts, wherein the lifting/lowering drive mechanism drives the first and second lead screws to move the port door upwards or downwards via the timing pulleys and timing belts through the power generated by the motor;
  protective covers covering the first and second port plate supporters, repectively;
  an intake filtering system having a filter installed in the base and a plurality of intake pipes installed at openings of the protective covers to form an air shield to prevent particles from going out and contaminating wafers; and
  for each of the first and second lead screws, a spring grommet installed between a top end thereof and the port plate and a spring grommet installed between a bottom end thereof and the base for absorbing a pitch error between the screw nut and the corresponding lead screw.
2. The apparatus for loading and unloading wafers of claim 1, wherein the apparatus further comprises a pod hold-down latch mechanism module and a wafer reseat mechanism module installed on the port plate.

3. The apparatus for loading and unloading wafers of claim 1, wherein each of the first and second port plate supporters are made of a U-shaped plates with high rigidity.

4. The apparatus for loading and unloading wafers of claim 1, wherein the apparatus further comprises a pod unlock mechanism module installed on the port door.

5. The apparatus for loading and unloading wafers of claim 1, wherein sides of the port door are secured to drive plates, each of said drive plates having one of the screw nuts thereon to be screwed to one of said lead screws via corresponding screw nuts, two shaft bearings being installed on one of said drive plates, said two shaft bearings being slidably matched on two lead poles to form said lead device.

6. The apparatus for loading and unloading wafers of claim 1, wherein the base has a plurality of positioning holes disposed thereon to be fixed on the fabrication equipment.

7. The apparatus for loading and unloading wafers of claim 1, wherein the lifting/lowering drive mechanism further has idle wheels contacting the timing pulleys.

\* \* \* \* \*